US011265520B2

(12) United States Patent
Hasegawa

(10) Patent No.: US 11,265,520 B2
(45) Date of Patent: Mar. 1, 2022

(54) SOLID-STATE IMAGING DEVICE AND INFORMATION PROCESSING DEVICE

(71) Applicant: Sony Mobile Communications Inc., Tokyo (JP)

(72) Inventor: Masaaki Hasegawa, Tokyo (JP)

(73) Assignee: SONY MOBILE COMMUNICATIONS INC., Tokyo (JP)

( * ) Notice: Subject to any disclaimer, the term of this patent is extended or adjusted under 35 U.S.C. 154(b) by 0 days.

(21) Appl. No.: 16/497,447

(22) PCT Filed: Mar. 1, 2018

(86) PCT No.: PCT/JP2018/007864
§ 371 (c)(1),
(2) Date: Sep. 25, 2019

(87) PCT Pub. No.: WO2018/193727
PCT Pub. Date: Oct. 25, 2018

(65) Prior Publication Data
US 2020/0106994 A1  Apr. 2, 2020

(30) Foreign Application Priority Data

Apr. 21, 2017 (JP) .............................. JP2017-084523

(51) Int. Cl.
*H04N 9/04* (2006.01)
*H01L 27/146* (2006.01)
(Continued)

(52) U.S. Cl.
CPC ..... *H04N 9/0455* (2018.08); *H01L 27/14621* (2013.01); *H01L 27/14625* (2013.01);
(Continued)

(58) Field of Classification Search
CPC .. H04N 9/045; H04N 9/0455; H04N 9/04551; H04N 9/04557; H04N 9/04459; H04N 9/04561
(Continued)

(56) References Cited

U.S. PATENT DOCUMENTS 6,222,631 B1 * 4/2001 Terauchi ................... G01J 3/36
250/226
6,611,289 B1 * 8/2003 Yu ........................... H04N 9/045
348/265

(Continued)

FOREIGN PATENT DOCUMENTS

JP    2003-143459 A    5/2003
JP    2009-164654 A    7/2009
(Continued)

OTHER PUBLICATIONS

International Search Report and Written Opinion dated May 1, 2018 for PCT/JP2018/007864 filed on Mar. 1, 2018, 10 pages including English Translation of the International Search Report.
(Continued)

*Primary Examiner* — Anthony J Daniels
(74) *Attorney, Agent, or Firm* — Xsensus, LLP

(57) ABSTRACT

To provide a solid-state imaging device capable of generating image data exposed by light of different wavelengths in a single imaging.

There is provided a solid-state imaging device including: a plurality of lenses configured to condense light; a filter unit having a plurality of regions respectively irradiated by light passing through the plurality of lenses, the plurality of regions including transmission patterns configured to transmit different wavelength bands of the light; and an image sensor in which pixels configured to convert light transmitted through the filter unit into electric signals are arranged in
(Continued)

a matrix, the image sensor being provided with color filters that correspond to the transmission patterns on a filter-unit side of the pixels.

15 Claims, 10 Drawing Sheets

(51) Int. Cl.
*H04N 9/79* (2006.01)
*G02B 5/20* (2006.01)
(52) U.S. Cl.
CPC ........... *H04N 9/7908* (2013.01); *G02B 5/201* (2013.01); *H01L 27/14618* (2013.01)
(58) Field of Classification Search
USPC ................................. 348/272, 277, 279, 280
See application file for complete search history.

(56) References Cited

U.S. PATENT DOCUMENTS

| | | | | |
|---|---|---|---|---|
| 8,081,311 | B2* | 12/2011 | Themelis | G01J 3/2823 |
| | | | | 356/419 |
| 9,258,495 | B2* | 2/2016 | Zeng | G01J 5/0806 |
| 9,972,651 | B2* | 5/2018 | Wang | H01L 27/14621 |
| 10,051,159 | B2* | 8/2018 | Matsuzaki | G02B 27/0018 |
| 2003/0086013 | A1 | 5/2003 | Aratani | |
| 2007/0097249 | A1* | 5/2007 | Korenaga | H04N 3/1593 |
| | | | | 348/335 |
| 2010/0140461 | A1* | 6/2010 | Sprigle | G02B 5/201 |
| | | | | 250/226 |
| 2013/0331669 | A1* | 12/2013 | Berte | G06K 9/2018 |
| | | | | 600/324 |
| 2015/0381907 | A1 | 12/2015 | Boettiger et al. | |
| 2016/0094781 | A1* | 3/2016 | Ebato | H04N 5/23245 |
| | | | | 348/345 |
| 2016/0099272 | A1 | 4/2016 | Wang | |
| 2017/0134704 | A1 | 5/2017 | Otsubo et al. | |
| 2018/0292706 | A1* | 10/2018 | Themelis | H04N 5/2254 |
| 2019/0025482 | A1* | 1/2019 | Lee | G02B 5/28 |
| 2019/0363116 | A1* | 11/2019 | Raz | G02B 5/284 |

FOREIGN PATENT DOCUMENTS

| | | |
|---|---|---|
| JP | 2011-22432 A | 2/2011 |
| JP | 2016-075886 A | 5/2016 |
| WO | 2015/199163 A1 | 12/2015 |

OTHER PUBLICATIONS

Extended European Search Report dated Mar. 23, 2020, issued in corresponding European Patent Application No. 18787756.8.
Office Action dated Oct. 20, 2020, in corresponding Japanese patent Application No. 2017-084523, 12 pages.

* cited by examiner

SOLID-STATE IMAGING DEVICE AND INFORMATION PROCESSING DEVICE

CROSS-REFERENCE TO RELATED APPLICATIONS

The present application is based on PCT filing PCT/JP2018/007864, filed Mar. 1, 2018, which claims priority to JP 2017-084523, filed Apr. 21, 2017, the entire contents of each are incorporated herein by reference.

TECHNICAL FIELD

The present disclosure relates to a solid-state imaging device and an information processing device.

BACKGROUND ART

For example, Patent Literature 1 discloses technology related to a compound-eye camera module provided with a plurality of lenses.

CITATION LIST

Patent Document

Patent Document 1: Japanese Patent Application Laid-Open No. 2009-164654

SUMMARY OF THE INVENTION

Problems to be Solved by the Invention

An object of the compound-eye camera module described in Patent Literature 1 above is to measure the distance to a subject. By providing a plurality of lenses, it is possible to obtain a plurality of image data in a single imaging.

Accordingly, the present disclosure proposes a novel and improved solid-state imaging device and information processing device capable of generating image data exposed by light of different wavelengths in a single imaging.

Solutions to Problems

According to the present disclosure, there is provided a solid-state imaging device including: a plurality of lenses configured to condense light; a filter unit having a plurality of regions respectively irradiated by light passing through the plurality of lenses, the plurality of regions including transmission patterns configured to transmit different wavelength bands of the light; and an image sensor in which pixels configured to convert light transmitted through the filter unit into electric signals are arranged in a matrix, the image sensor being provided with color filters that correspond to the transmission patterns on a filter-unit side of the pixels.

Also, according to the present disclosure, an information processing device provided with the above solid-state imaging device is provided.

Effects of the Invention

According to the present disclosure as described above, it is possible to provide a novel and improved solid-state imaging device and information processing device capable of generating image data exposed by light of different wavelengths in a single imaging.

Note that the above effects are not strictly limiting, and that any effect indicated in the present disclosure or another effect that may be reasoned from the present disclosure may also be exhibited in addition to, or instead of, the above effects.

MODE FOR CARRYING OUT THE INVENTION

Figure 1:
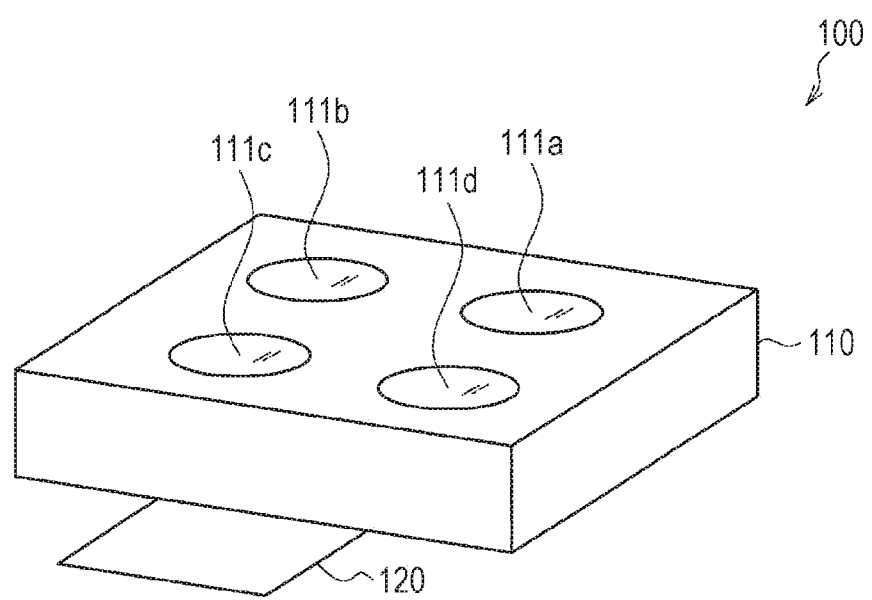
FIG. 1 is an explanatory diagram illustrating an exemplary external appearance of a sensor module according to an embodiment of the present disclosure.

Hereinafter, (a) preferred embodiment(s) of the present disclosure will be described in detail with reference to the appended drawings. Note that, in this specification and the appended drawings, structural elements that have substantially the same function and configuration are denoted with the same reference numerals, and repeated explanation of these structural elements is omitted.

Note that, hereinafter, the description will proceed in the following order.

1. Embodiment of present disclosure
1.1. Exemplary external appearance of sensor module
1.2. Functions of sensor module
1.3. Exemplary configuration of device provided with sensor module
2. Conclusion

1. Embodiment of Present Disclosure

[1.1. Exemplary External Appearance of Sensor Module]

First, an exemplary external appearance of the sensor module according to an embodiment of the present disclosure will be described with reference to the drawings. FIG. 1 is an explanatory diagram illustrating an exemplary external appearance of the sensor module according to the embodiment of the present disclosure. Hereinafter, FIG. 1 will be used to describe the exemplary external appearance of the sensor module according to the embodiment of the present disclosure.

A sensor module 100 illustrated in FIG. 1 is a sensor module that may be installed in a portable device carried by a user, such as a smartphone, a tablet terminal, a game console, or a portable music player, for example. As illustrated in FIG. 1, the sensor module 100 according to the embodiment of the present disclosure includes a housing 110 and a rigid flexible board 120. Four lenses 111a to 111d are provided on the light-incident face of the housing 110. Note that although the present embodiment illustrates an example in which four lenses of the sensor module 100 are provided, the present disclosure is not limited to such an example.

As described later, the sensor module 100 is provided with a bandpass filter inside the housing 110. Also, an image sensor is formed on the rigid flexible board 120. Additionally, in the sensor module 100 according to the present embodiment, the bandpass filter is divided into four regions, and against light passing through each of the four lenses 111a to 111d, light of a predetermined wavelength band (frequency band) is passed via the bandpass filter, and that light is made to irradiate the image sensor. By having such a configuration, the sensor module 100 according to the present embodiment is capable of generating image data exposed by light of different wavelength bands (frequency bands) in a single imaging.

The above describes an exemplary external appearance of the sensor module according to the embodiment of the present disclosure. Next, the internal structure of the sensor module according to the embodiment of the present disclosure will be described using an exploded perspective view.

Figure 2:
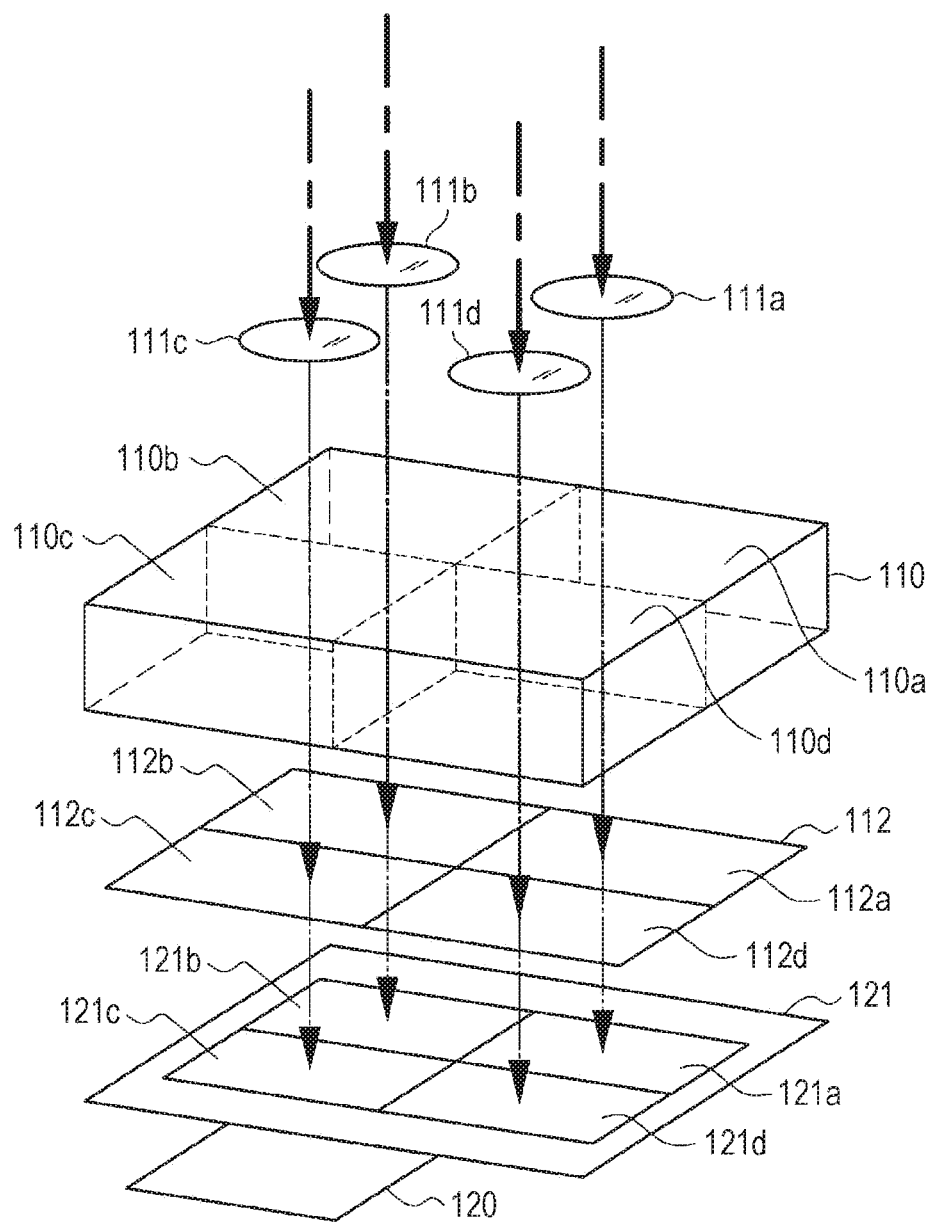
FIG. 2 is an explanatory diagram illustrating an exploded perspective view of the internal structure of the sensor module according to the embodiment.

FIG. 2 is an explanatory diagram illustrating an exploded perspective view of the internal structure of the sensor module according to the embodiment of the present disclosure. Hereinafter, FIG. 2 will be used to describe the internal structure of the sensor module according to the embodiment of the present disclosure.

As described above, the housing 110 is provided with four lenses 111a to 111d. Additionally, the interior of the housing 110 is divided into four regions 110a to 110d as illustrated in FIG. 2.

A bandpass filter 112 passes light of a predetermined frequency band wavelength band (frequency band) against light passing through the four lenses 111a to 111d. Additionally, in the present embodiment, the bandpass filter 112 includes four bandpass filters 112a to 112d having respectively different pass patterns. Light that has passed through the lens 111a passes through the bandpass filter 112a. Similarly, light that has passed through the lens 111b passes through the bandpass filter 112b, light that has passed through the lens 111c passes through the bandpass filter 112c, and light that has passed through the lens 111d passes through the bandpass filter 112d. Light that has passed through the bandpass filter 112 is radiated onto an image sensor 121.

The image sensor 121 is an image sensor provided with a charge-coupled device (CCD) or complementary metal-oxide semiconductor (CMOS) imaging element, for example, and converts light that has passed through the bandpass filter 112 into an electric signal. In the present embodiment, the image sensor 121 is divided into four regions 121a to 121d, and respectively converts light that has passed through the bandpass filters 112a to 112d into electric signals. Also, the image sensor 121 is provided with color filters on top of the imaging element.

The above describes the internal structure of the sensor module according to the embodiment of the present disclosure using an exploded perspective view. Next, effective regions of the image sensor 121 provided in the sensor module according to the embodiment of the present disclosure will be described. Herein, an effective region of the image sensor 121 refers to a region irradiated by light through a lens.

Figure 3:
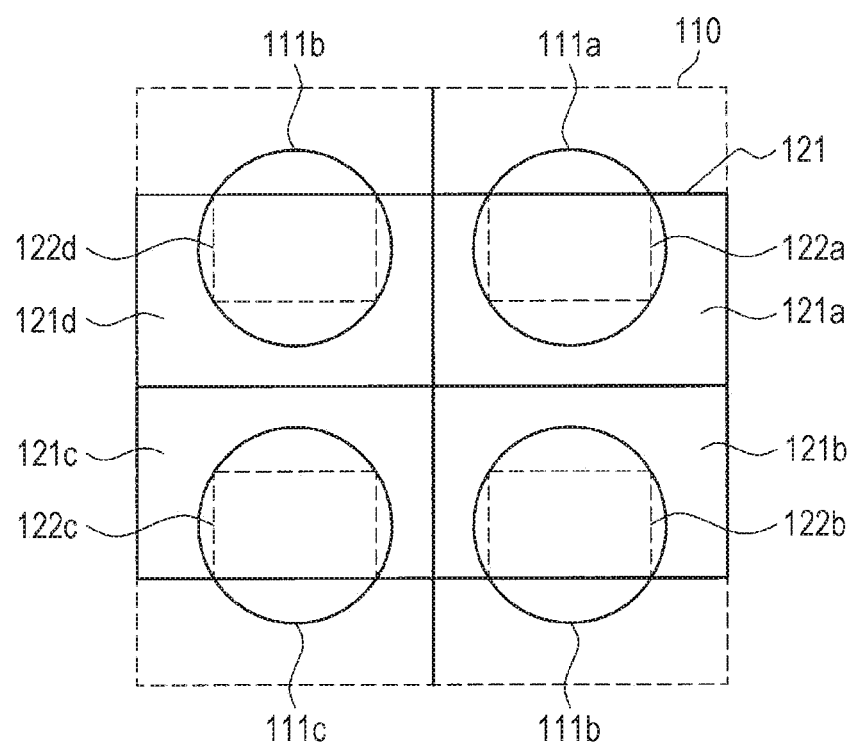
FIG. 3 is an explanatory diagram illustrating the effective region of an image sensor.

FIG. 3 is an explanatory diagram illustrating effective regions of the image sensor 121, and is a diagram illustrating the state of the sensor module 100 as viewed from the side on which the lenses 111a to 111d are provided. As illustrated in FIG. 3, by providing the lenses 111a to 111d, four effective regions 122a to 122d exist on the image sensor 121. The image sensor 121 generates image data by photo-electrically converting light radiated onto the effective regions 122a to 122d.

Note that in the case in which the lenses 111a to 111d are provided above the image sensor 121 in this way, pupil correction may also be performed such that incident light passing through the lenses 111a to 111d is made to irradiate the image sensor 121 efficiently. Pupil correction is a correction that adjusts the lenses 111a to 111d to match the angle of incidence of light rays in a central part and a peripheral part of the lenses 111a to 111d.

[1.2. Functions of Sensor Module]

Next, functions of the sensor module according to the embodiment of the present disclosure will be described. As described above, the sensor module 100 according to the embodiment of the present disclosure is provided with the bandpass filter 112 that includes four bandpass filters 112a to 112d having different pass patterns. Each of the bandpass filters 112a to 112d is a bandpass filter that passes light of a predetermined range of wavelength bands while attenuating light of other wavelength bands, or alternatively is a combination of such bandpass filters.

In an ordinary sensor module, blue, green and red color filters corresponding to the three primary colors of light are provided in a Bayer array. Rather than being provided with color filters based on the above three primary colors of light, namely blue, green, and red, as described later, the image sensor 121 of the present embodiment is characterized by being provided with a color filter having a different array for each region for extracting the component of a desired frequency band.

Figure 4:
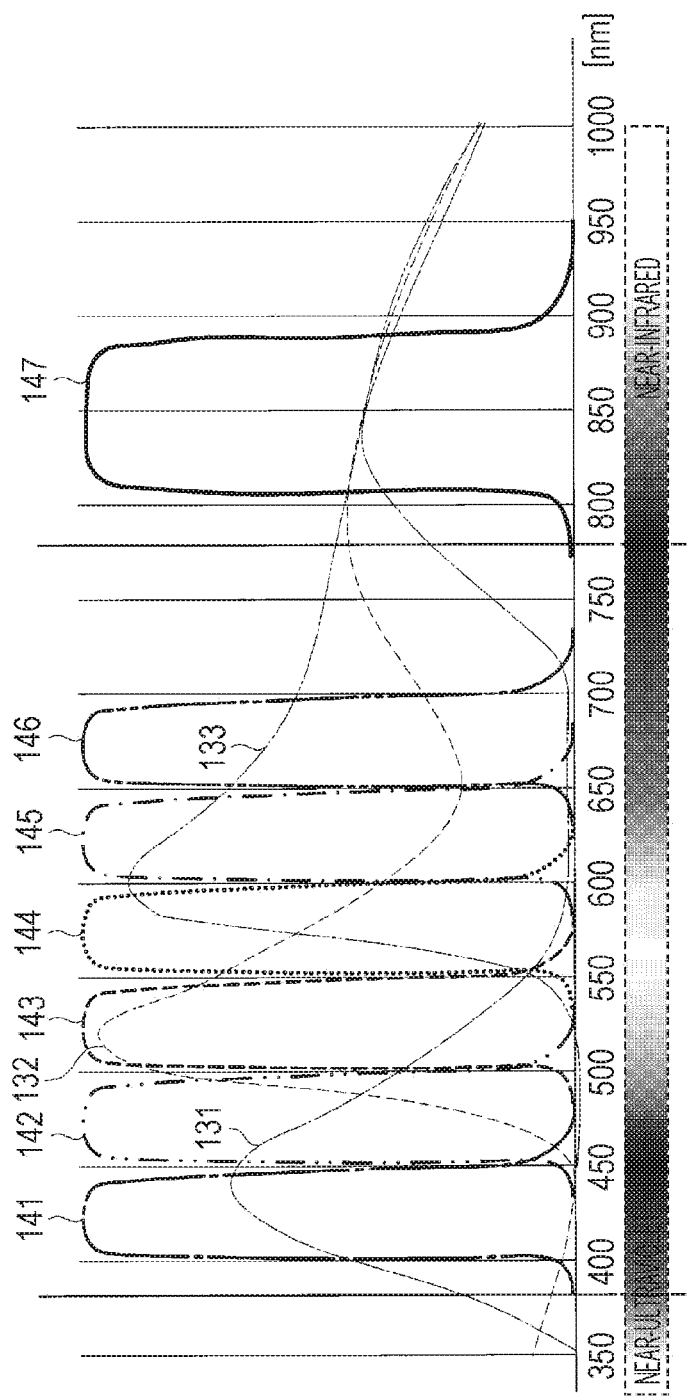
FIG. 4 is an explanatory diagram illustrating a graph of exemplary characteristics of blue, green, and red color filters corresponding to the three primary colors of light and exemplary characteristics of bandpass filters used in the sensor module according to the embodiment.

FIG. 4 is an explanatory diagram illustrating a graph of exemplary characteristics of blue, green, and red color filters corresponding to the three primary colors of light and exemplary characteristics of bandpass filters used in the sensor module 100 according to the embodiment of the present disclosure. The sign 131 denotes the characteristics of the blue color filter, the sign 132 denotes the characteristics of the green color filter, and the sign 133 denotes the characteristics of the red color filter. In contrast, the signs 141 to 147 denote exemplary characteristics of bandpass filters used in the sensor module 100 according to the embodiment of the present disclosure. In the following description, the bandpass filters used in the sensor module 100 are designated BPF1, BPF2, . . . , BPF7 in order of shortest wavelength. Additionally, the bandpass filters 112a to 112d have at least one from among BPF1 to BPF7.

For example, 500 nm to 550 nm is a wavelength band in which the chlorophyll of vegetables and plants is easily visualized. Consequently, in the case of wanting to use the sensor module 100 for the purpose of visualizing the chlorophyll of vegetables and plants, it is desirable to create and incorporate into the sensor module 100 a bandpass including BPF3.

In addition, as another example, 550 nm to 600 nm is a wavelength band in which metmyoglobin, a causative agent that turns brown as meat gets older, is easily visualized, and therefore is a wavelength band in which the deterioration of meat is easily visualized. Consequently, in the case of wanting to use the sensor module 100 for the purpose of visualizing the deterioration of meat, it is desirable to create and incorporate into the sensor module 100 a bandpass including BPF4.

In addition, for example, 600 nm to 650 nm is a wavelength band in which lycopene contained in tomatoes or the like is easily visualized. Consequently, in the case of wanting to use the sensor module 100 for the purpose of visualizing lycopene, it is desirable to create and incorporate into the sensor module 100 a bandpass including BPF5.

In addition, for example, 650 nm to 700 nm is a wavelength band in which components associated with the freshness of meat are easily visualized. Consequently, in the case of wanting to use the sensor module 100 for the purpose of visualizing components associated with the freshness of meat, it is desirable to create and incorporate into the sensor module 100 a bandpass including BPF6.

In addition, for example, 800 nm to 900 nm is a wavelength band in which the water content contained in vegetables and plants is easily visualized. Consequently, in the case of wanting to use the sensor module 100 for the purpose of visualizing the water content contained in vegetables and plants, it is desirable to create and incorporate into the sensor module 100 a bandpass including BPF7.

Additionally, by configuring the bandpass filter 112 with the plurality of bandpass filters 112a to 112d, the sensor module 100 according to the present embodiment is capable of accommodating these uses with a single sensor module 100.

However, if the color filters provided in the image sensor 121 are treated as color filters in a Bayer array using the three primary colors of light, namely, blue, green, and red, color filters with low sensitivity to light that has passed through the bandpass filter 112 will exist. For example, in pixels assigned to a green color filter, sensitivity is not obtained for wavelengths in the bands of 400 nm to 450 nm passed by BPF1 and 600 nm to 650 nm passed by BPF5. Consequently, for regions in which BPF1 or BPF5 is provided, little to no information is obtained from the green pixels. Therefore, the green pixels are wasted.

Accordingly, the sensor module 100 according to the present embodiment, to separate the components of the seven frequency bands described above from light that has passed through each of the bandpass filters 112a to 112d and also efficiently obtain information about the light that has passed through the bandpass filters 112a to 112d, color filters that correspond to the frequency band passed by each of the bandpass filters 112a to 112d are provided in the image sensor 121. In other words, compared to color filters in a Bayer array, color filters with an increased number of pixels from which information about light that has passed through the bandpass filters 112a to 112d is obtained are provided in the image sensor 121.

Besides the uses described above, the sensor module 100 according to the present embodiment is capable of accommodating a variety of uses by changing the combination of bandpass filters. For example, in cases in which it is difficult to discriminate between a human face and an elaborately crafted doll or the face of a mannequin by simply performing image processing alone, the change in the spectral reflectance of skin around certain wavelengths may be utilized, and bandpass filters that transmit light of those wavelengths may be provided in the sensor module 100. In this way, by providing bandpass filters that transmit the light of wavelengths at which the spectral reflectance of skin changes, the sensor module 100 according to the present embodiment may be used for biometric authentication.

Figure 5:
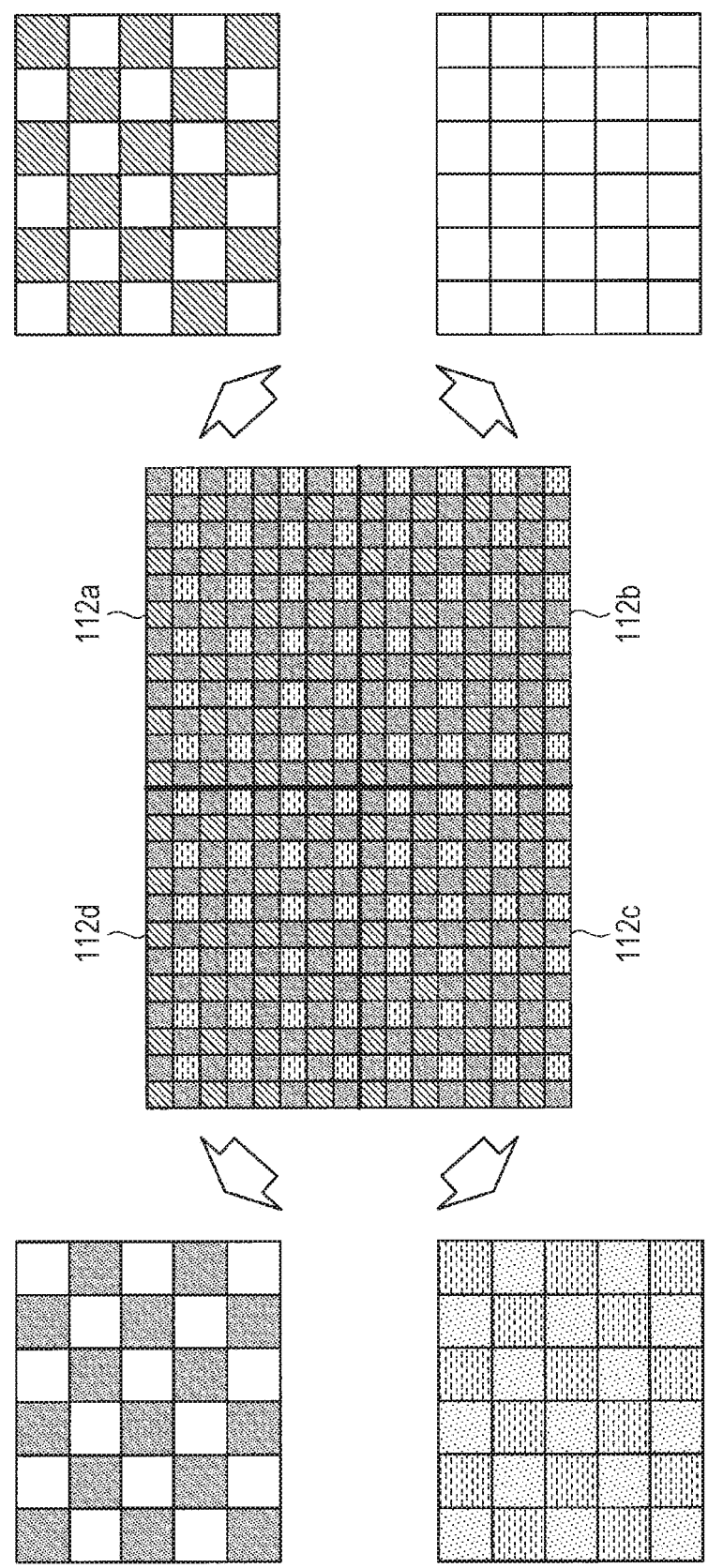
FIG. 5 is an explanatory diagram illustrating an example of a bandpass filter.

FIG. 5 is an explanatory diagram illustrating an example of bandpass filters configured as the bandpass filters 112a to 112d and color filters provided in the image sensor 121 in correspondence with each of the bandpass filters 112a to 112d. In the example illustrated in FIG. 5, the bandpass filter 112a includes BPF1 and BPF4. Similarly, the bandpass filter 112b includes BPF2 and BPF5. Also similarly, the bandpass filter 112c includes BPF3 and BPF6. Also similarly, the bandpass filter 112d includes BPF7.

In addition, the color filters provided in the image sensor 121 are formed such that the components of the frequency bands passed by each of the bandpass filters 112a to 112d are obtained. Since the bandpass filter 112a includes BPF1 and BPF4, in the region of the bandpass filter 112a, pixels that pair with the blue color filter and pixels without a color filter (black-and-white pixels) are arranged in a check pattern. Since the bandpass filter 112b includes BPF2 and BPF5, in the region of the bandpass filter 112b, pixels that pair with the red color filter and pixels that pair with the blue color filter are arranged in a check pattern. Since the bandpass filter 112c includes BPF3 and BPF6, in the region of the bandpass filter 112c, pixels that pair with the green color filter and pixels that pair with the red color filter are arranged in a check pattern. Since the bandpass filter 112d includes BPF7, in the region of the bandpass filter 112c, pixels without a color filter (black-and-white pixels) are arranged.

In this way, by forming color filters such that the components of the frequency bands passed by each of the bandpass filters 112a to 112d are obtained, the sensor module 100 according to the present embodiment forms a pixel array capable of extracting the component of each frequency band efficiently. Furthermore, the sensor module 100 according to the present embodiment is capable of extracting, in a single imaging, the components of seven desired frequency bands with four types of bandpass filters and ordinary color filters using the three primary colors of light, namely blue, green, and red.

Figure 6:
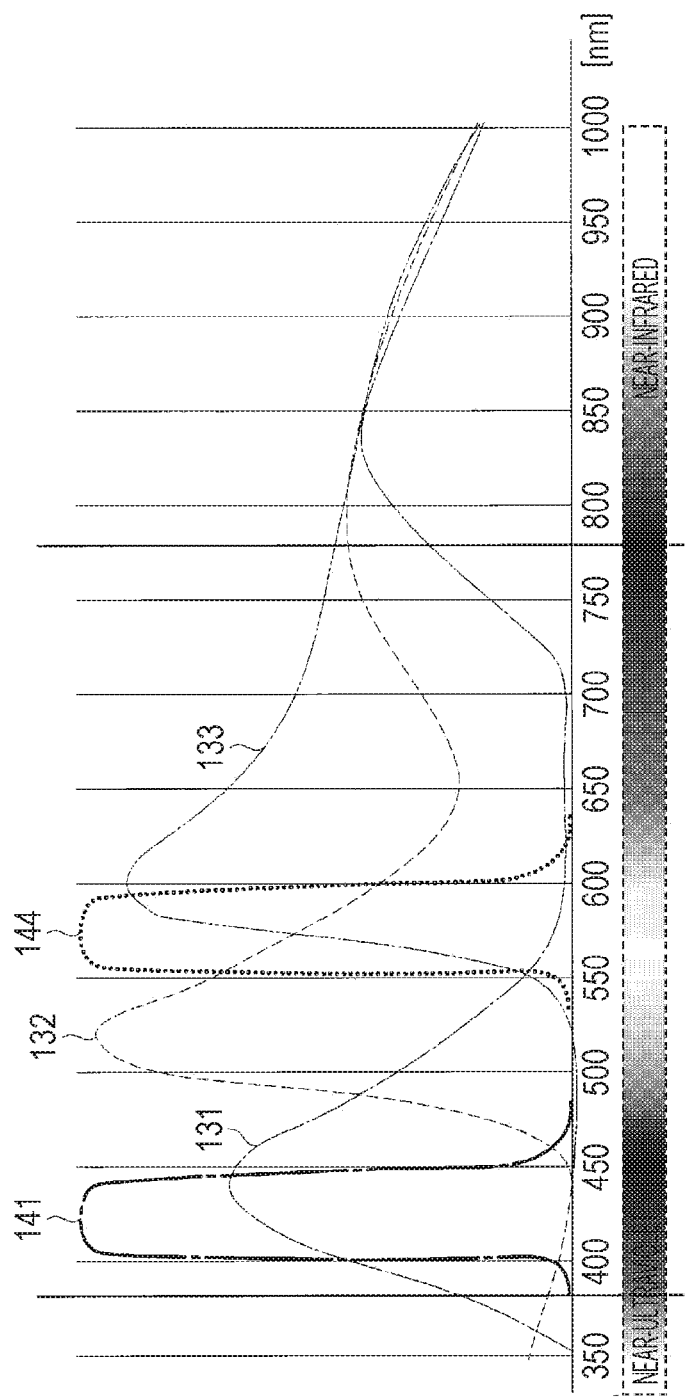
FIG. 6 is an explanatory diagram illustrating exemplary characteristics of a bandpass filter.
Figure 7:
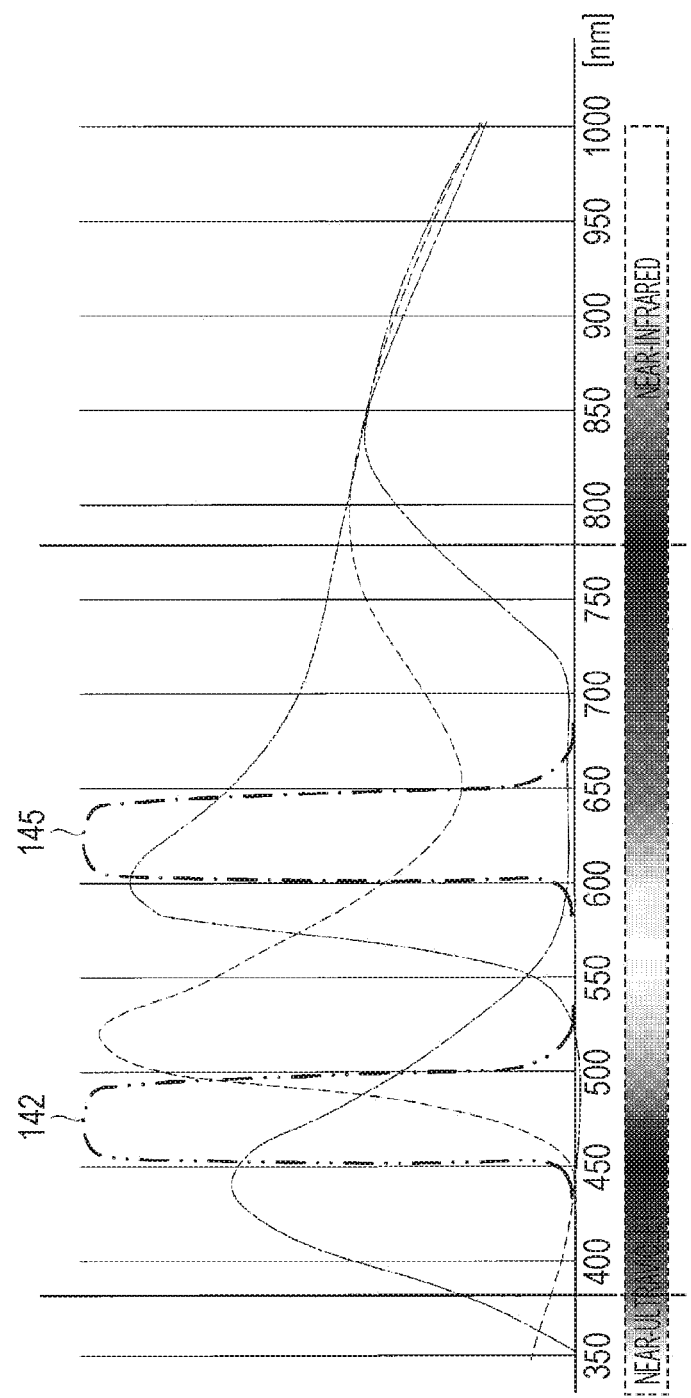
FIG. 7 is an explanatory diagram illustrating exemplary characteristics of a bandpass filter.
Figure 8:
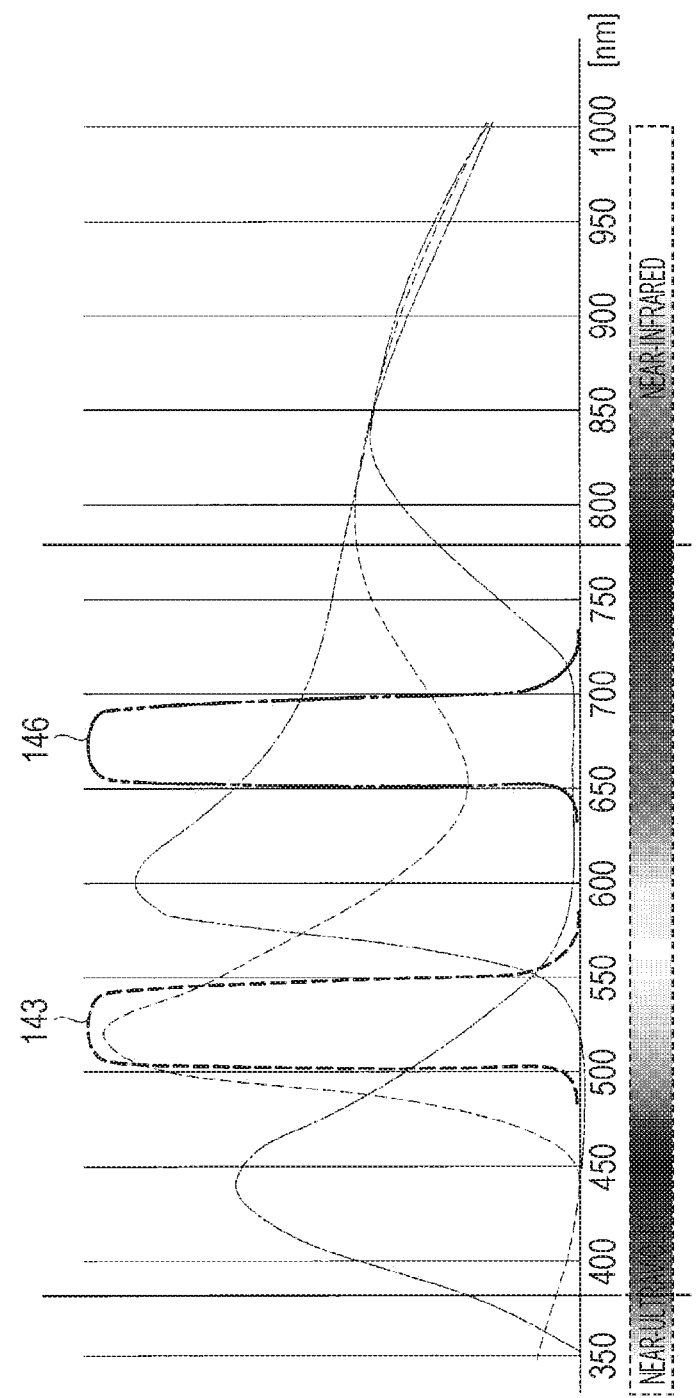
FIG. 8 is an explanatory diagram illustrating exemplary characteristics of a bandpass filter.
Figure 9:
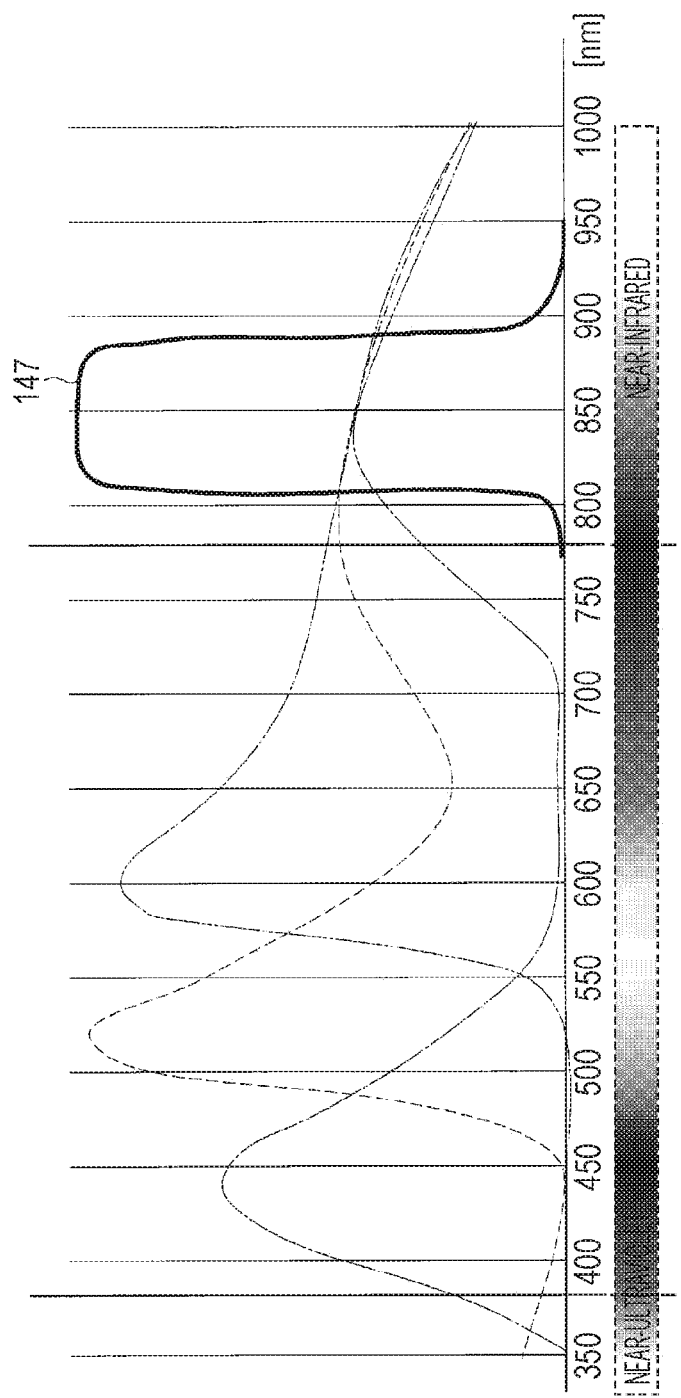
FIG. 9 is an explanatory diagram illustrating exemplary characteristics of a bandpass filter.

FIGS. 6 to 9 are explanatory diagrams illustrating exemplary characteristics of the bandpass filter 112a. Since the bandpass filter 112a includes BPF1 and BPF4, light in the wavelength bands as illustrated in FIG. 6 is passed, whereas light in other wavelength bands is attenuated. Since the bandpass filter 112b includes BPF2 and BPF5, light in the wavelength bands as illustrated in FIG. 7 is passed, whereas light in other wavelength bands is attenuated. Since the bandpass filter 112c includes BPF3 and BPF6, light in the wavelength bands as illustrated in FIG. 8 is passed, whereas light in other wavelength bands is attenuated. Additionally, since the bandpass filter 112d includes BPF7, light in the wavelength band as illustrated in FIG. 9 is passed, whereas light in other wavelength bands is attenuated.

By overlaying the four sorts of bandpass filters and color filters described above onto the single image sensor 121, the sensor module 100 according to the present embodiment is capable of generating image data appropriate to at least four sorts of uses.

A different example will be illustrated. In this example, assume that the bandpass filter 112a of the region 110a includes BPF1 and BPF5, the bandpass filter 112b of the region 110b includes BPF2 and BPF6, the bandpass filter 112c of the region 110c includes BPF3 and BPF7, and the bandpass filter 112d of the region 110d includes BPF4.

In this case, in the region of the bandpass filter 112a, pixels that pair with the blue color filter and pixels that pair with the red color filter are arranged in a check pattern. In the region of the bandpass filter 112b, pixels that pair with the blue color filter and pixels that pair with the red color filter are arranged in a check pattern. In the region of the bandpass filter 112c, pixels that pair with the green color filter and pixels without a color filter (black-and-white pixels) are arranged in a check pattern. In the region of the bandpass filter 112d, pixels without a color filter (black-and-white pixels) are arranged. Thus, by forming the color filter on the image sensor 121, the sensor module 100 is capable of extracting, in a single imaging, the components of seven desired frequency bands with four types of bandpass filters and ordinary color filters using the three primary colors of light, namely blue, green, and red.

A different example will be illustrated. Also in this example, assume that the bandpass filter 112a of the region 110a includes BPF1 and BPF5, the bandpass filter 112b of the region 110b includes BPF2 and BPF6, the bandpass filter 112c of the region 110c includes BPF3 and BPF7, and the bandpass filter 112d of the region 110d includes BPF4.

In this case, in the region of the bandpass filter 112a, pixels that pair with the red color filter and pixels without a color filter (black-and-white pixels) are arranged in a check pattern. The component of the frequency band of BPF5 can be extracted by the pixels that pair with the red color filter. On the other hand, the component of the frequency band of BPF1 can be extracted by subtracting that which is obtained by the pixels that pair with the red color filter from that which is obtained by the pixels without a color filter (black-and-white pixels).

Furthermore, in the region of the bandpass filter 112b, pixels that pair with the blue color filter and pixels without a color filter (black-and-white pixels) are arranged in a check pattern. The component of the frequency band of BPF2 can be extracted by the pixels that pair with the blue color filter. On the other hand, the component of the frequency band of BPF6 can be extracted by subtracting that which is obtained by the pixels that pair with the blue color filter from that which is obtained by the pixels without a color filter (black-and-white pixels).

Furthermore, in the region of the bandpass filter 112c, pixels that pair with the green color filter and pixels without a color filter (black-and-white pixels) are arranged in a check pattern. The component of the frequency band of BPF3 can be extracted by the pixels that pair with the green color filter. On the other hand, the component of the frequency band of BPF7 can be extracted by the pixels without a color filter (black-and-white pixels). Also, in the region of the bandpass filter 112d, pixels without a color filter (black-and-white pixels) are arranged. The component of the frequency band of BPF4 can be extracted by the pixels without a color filter (black-and-white pixels).

In this way, by appropriately combining color filters, the sensor module 100 according to the embodiment of the present disclosure becomes capable of extracting the components of desired frequency bands efficiently.

[1.3. Exemplary Configuration of Device Provided With Sensor Module]

Next, an exemplary functional configuration of an information processing device incorporating the sensor module 100 according to the embodiment of the present disclosure will be described.

Figure 10:
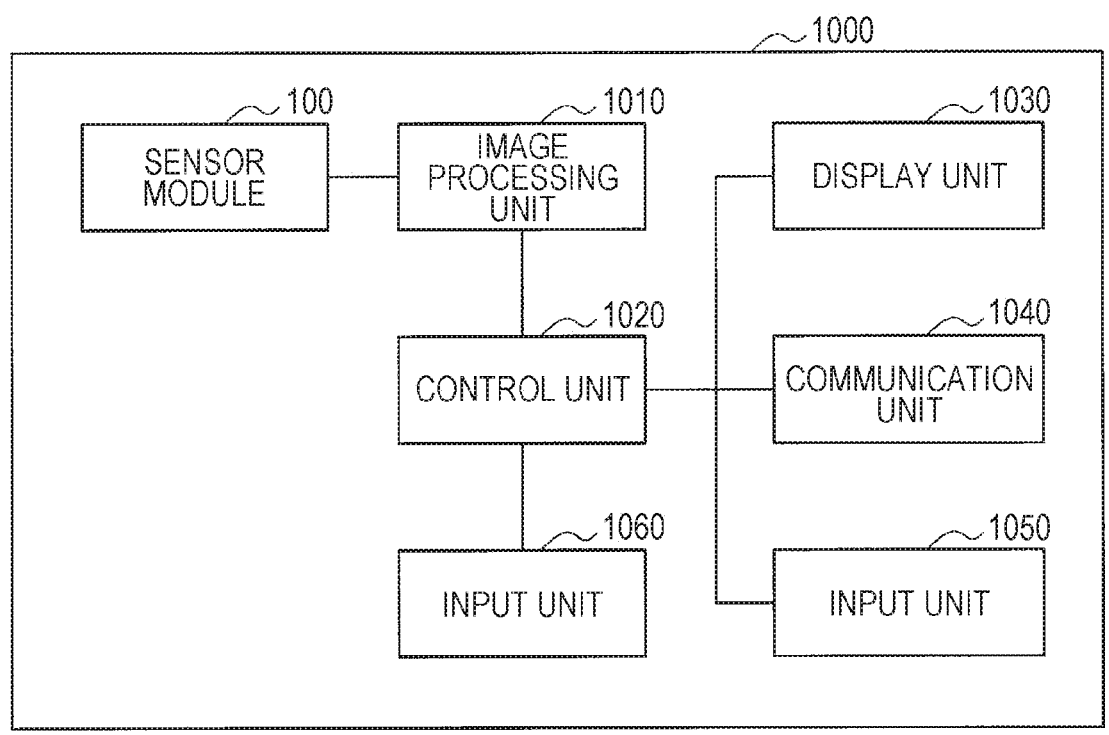
FIG. 10 is an explanatory diagram illustrating an exemplary functional configuration of an information processing device incorporating the sensor module according to the embodiment.

FIG. 10 is an explanatory diagram illustrating an exemplary functional configuration of an information processing device 1000 incorporating the sensor module 100 according to the embodiment of the present disclosure. As illustrated in FIG. 10, the information processing device 1000 includes the sensor module 100, an image processing unit 1010, a control unit 1020, a display unit 1030, a communication unit 1040, an input unit 1050, and a storage unit 1060.

Image data generated by the sensor module 100 is sent to the image processing unit 1010. The image processing unit 1010 includes a circuit that executes image processing, such as a graphics processing unit (GPU), and executes various types of image processing on the image data output by the sensor module 100. For example, the image processing unit 1010 performs noise removal, partitioning into image data of each of the regions 121a to 121d of the image sensor 121, and the like. The image processing unit 1010 outputs the image-processed image data to the control unit 1020.

The control unit 1020 includes a central processing unit (CPU), a micro-processing unit (MPU), or the like, and controls the operations of the information processing device 1000.

The display unit 1030 includes a liquid crystal display or an organic EL display, for example. The display unit 1030 may also be provided with a touch panel that a user operates by touching a screen directly. The communication unit 1040 executes a process of communicating with another device by, for example, performing cellular communication, connecting to a wireless LAN or the like, or using a wireless communication standard such as infrared communication or Bluetooth (registered trademark). The input unit 1050 is a device for enabling the user to perform input operations, and may include for example a keyboard and mouse, a touch panel, or the like. The storage unit 1060 includes non-volatile or volatile memory, for example, holds programs and data necessary for operations of the information processing device 1000, and stores logs of operations of the information processing device 1000.

Note that although FIG. 10 illustrates the information processing device 1000 incorporating only the sensor module 100 according to the embodiment of the present disclosure, the present disclosure is not limited to such an example, and the information processing device 1000 may also incorporate a sensor module provided with color filters in an ordinary Bayer array in addition to the sensor module 100.

The information processing device 1000, by being provided with the sensor module 100 according to the embodiment of the present disclosure, is capable of obtaining image data to be used for a variety of purposes with a single imaging process. For example, the information processing device 1000 provided with the sensor module 100 according to the embodiment of the present disclosure can be used to visualize the state of chlorophyll and water content in vegetables and plants or to visualize components associated with the deterioration and freshness of meat as described above.

2. Conclusion

According to the embodiment of the present disclosure as described above, there is provided the sensor module 100 capable of generating image data exposed by light of different wavelength bands (frequency bands) in a single imaging process, as well as the information processing device 1000 provided with such a sensor module 100.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present disclosure may also be configured as below.

(1)

A solid-state imaging device including:

a plurality of lenses configured to condense light;

a filter unit having a plurality of regions respectively irradiated by light passing through the plurality of lenses, the plurality of regions including transmission patterns configured to transmit different wavelength bands of the light; and an image sensor in which pixels configured to convert light transmitted through the filter unit into electric signals are arranged in a matrix, the image sensor being provided with color filters that correspond to the transmission patterns on a filter-unit side of the pixels.

(2)

The solid-state imaging device according to (1), in which the transmission patterns are at least one selected from among bandpass filters configured to transmit respectively different wavelength bands.

(3)

The solid-state imaging device according to (2), in which the transmission patterns are two bandpass filters having non-adjacent wavelength bands selected from among the bandpass filters configured to transmit respectively different wavelength bands.

(4)

The solid-state imaging device according to (2) or (3), in which the wavelength bands transmitted by the bandpass filters are set in intervals of at least 50 nm.

(5)

The solid-state imaging device according to any one of ( ) to (4), in which the color filters are formed in correspondence with each of the pixels of the image sensor.

(6)

An information processing device including: the solid-state imaging device according to any one of (1) to (5).

REFERENCE SIGNS LIST

100 Sensor module
110 Housing
111a Lens
111b Lens
111c Lens
111d Lens
112 Bandpass filter
112a Bandpass filter
112b Bandpass filter
112c Bandpass filter
112d Bandpass filter
120 Rigid flexible board
121 Image sensor
121a Region
121b Region
121c Region
121d Region
122a Effective region
122b Effective region
122c Effective region
122d Effective region
1000 Information processing device

The invention claimed is:

1. A solid-state imaging device comprising:

a plurality of lenses configured to condense light, wherein the plurality of lenses are arranged such that each of a plurality of rays of incident light passes through only a respective one of the plurality of lenses;

a filter having a plurality of regions respectively irradiated by the plurality of rays of incident light passing through the plurality of lenses, the plurality of regions including transmission patters configured to transmit different wavelength bands of the light, wherein each of the plurality of lenses corresponds to a respective one of the plurality of regions; and an image sensor in which pixels configured to convert light transmitted through the filter into electric signals are arranged in a matrix, the image sensor being provided with color filters that correspond to the transmission patterns on a filter side of the pixels.

2. The solid-state imaging device according to claim 1, wherein the transmission patterns are at least one selected from among bandpass filters configured to transmit respectively different wavelength bands.

3. The solid-state imaging device according to claim 2, wherein the transmission patterns are two bandpass filters having non-adjacent wavelength bands selected from among the bandpass filters configured to transmit respectively different wavelength bands.

4. The solid-state imaging device according to claim 2, wherein the wavelength bands transmitted by the bandpass filters are set in intervals of at least 50 nm.

5. The solid-state imaging device according to claim 1, wherein the color filters are formed in correspondence with each of the pixels of the image sensor.

6. The solid-state imaging device according to claim 1, wherein the plurality of lenses are arranged in a plane that is substantially perpendicular to a direction of the plurality of rays of incident light.

7. The solid-state imaging device according to claim 1, further comprising:

a housing divided into four adjacent regions, wherein each adjacent region contains a respective one of the plurality of lenses and the respective one of the plurality of regions.

8. The solid-state imaging device according to claim 1, wherein each of the plurality of regions of the filter corresponds to one of the plurality of lenses.

9. The solid-state imaging device according to claim 1, wherein each of the plurality of rays of incident light corresponds to a respective portion of an object being imaged.

10. The solid-state imaging device according to claim 1, wherein the plurality of lenses are configured to perform pupil correction on the plurality of rays of incident light.

11. The solid-state imaging device according to claim 1, Wherein the image sensor comprises a plurality of effective regions, each of the plurality of effective regions corresponds to one of the plurality of regions of the filter, and the color filters correspond to the different wavelength bands of the light transmitted in each of the plurality of regions of the filter.

12. The solid-state imaging device according to claim 1, wherein each pixel of the image sensor corresponds to one of the color filters, and the pixels are arranged to form a check pattern of at least two different colors of the color filters.

13. The solid-state imaging device according to claim 1, wherein the pixels of the image sensor are arranged in a single plane.

14. The solid-state imaging device according to claim 1, wherein the plurality of lenses are arranged adjacent to one another in a plane.

15. An information processing device comprising: the solid-state imaging device according to claim 1.

* * * * *